United States Patent [19]

Satoh et al.

[11] Patent Number: 4,985,226
[45] Date of Patent: Jan. 15, 1991

[54] HOLE-BURNING MATERIAL AND PRODUCTION THEREOF

[75] Inventors: Shuichi Satoh; Kazuwo Tsuji; Takeru Nakashima; Shuji Yazu, all of Itami; Yosio Nisida, Takatsuki; Kiyofumi Muro, Ichihara; Yuzo Demizu, Kamifukuoka; Masuo Nakagawa, Takamatsu; Moritami Okada, Osaka, all of Japan

[73] Assignee: Sumitomo Electric Industries, Ltd., Osaka, Japan

[21] Appl. No.: 366,655

[22] Filed: Jun. 15, 1989

[30] Foreign Application Priority Data

Jun. 20, 1988 [JP] Japan .............................. 63-153044
Jul. 8, 1988 [JP] Japan .............................. 63-171635
Sep. 26, 1988 [JP] Japan .............................. 63-241279
Jan. 7, 1989 [JP] Japan .............................. 1-1461

[51] Int. Cl.$^5$ ............................................. C01B 31/06
[52] U.S. Cl. ........................... 423/446; 156/DIG. 68; 365/119; 501/86
[58] Field of Search ............... 423/446; 156/DIG. 68; 501/86; 365/119

[56] References Cited

U.S. PATENT DOCUMENTS

| | | | |
|---|---|---|---|
| 3,654,626 | 4/1972 | Geller et al. | 340/773 CC |
| 3,961,103 | 6/1976 | Aisenberg | 423/446 |
| 4,399,364 | 8/1983 | Evans et al. | 423/446 |
| 4,434,188 | 2/1984 | Kamo et al. | 423/446 |
| 4,617,181 | 10/1986 | Yazu et al. | 423/446 |

FOREIGN PATENT DOCUMENTS

| | | | |
|---|---|---|---|
| 0195678 | 9/1986 | European Pat. Off. | 423/446 |
| 0265260 | 4/1988 | European Pat. Off. | 365/119 |
| 64-20689 | 1/1989 | Japan | 423/446 |
| 8603347 | 6/1986 | World Int. Prop. O. | 372/42 |

OTHER PUBLICATIONS

Collins et al., Luminescence Decay Time of the 1.945 eV Centre In Type Ib Diamond, J. Physics, C: Solid State Physics, 16 (1983) 2177–2181.
R. T. Harley et al., "Persistent Spectral Hole Burning of Colour . . . ", J. Phys. C. vol. 17, No. 8, 1984, pp. L233 L235.
A. T. Collins, "Vacancy Enhanced Aggregation of Nitrogen in Diamond", J. Phys. C. vol. 13, 1980, pp. 2641–2650.
P. D. Bloch et al., "Effects of Microwave Excitation on Spectral . . . ", Journal De Physique, vol. 46, Oct. 1985, pp. 527–530.
N. R. S. Reddy et al., "Two-Laser Spectral Hole Burning in a Colour Centre in Diamond", J. Lumin, vol. 38, 1987, pp. 46–47.

Primary Examiner—Olik Chaudhuri
Assistant Examiner—Robert M. Kunemund
Attorney, Agent, or Firm—Cushman, Darby & Cushman

[57] ABSTRACT

A hole-burning material which comprises at least one hole which is formed on a zero-phonone line and semi-permanently lasts without suffering from any change in the temperature range from 2 to 120 K and which can be erased by irradiation of excited light having an energy larger than the zero-phonone line, in which the burnt holes have long life and deep depth and any single holes can be erased.

9 Claims, 6 Drawing Sheets

HOLE-BURNING MATERIAL AND PRODUCTION THEREOF

BACKGROUND OF THE INVENTION

1. Field of the Invention

The present invention relates to a hole-burning material and a method for producing the same. More particularly, the present invention relates to a hole-burning material which utilizes the hole-burning phenomenon of color centers in diamond and a method for producing such diamond hole-burning material.

2. Description of the Related Art

Hitherto, organic dyes such as porphyrins and quinizarin (1,4-dihydroxyanthraquinone) contained in a matrix such as n-hexane are used as hole-burning materials (cf. "KAGAKU TO KOGYO" (Chemistry and Industry), Vol. 35, No. 9 (1982) 633–635). In use, such the organic dye base hole-burning materials should be cooled to the liquid helium temperature, and most of them have such defect that the once-formed holes have short life. If the hole-burning materials have holes with a semipermanently long life, the holes cannot be erased at low temperature. To erase such long-life holes, the hole-burning material should be heated up to around room temperature. However, all the holes are erased by heating the hole-burning material.

In addition to the organic dyes, alkali halide compounds are irradiated with electron beam to create the color center and used as hole-burning materials. Again, such the alkali halide base hole-burning materials have the same defects as the organic dye base hole-burning material.

Alternatively, R. T. Horley et al reported the hole-burning phenomenon observed in diamond having various color centers such as GR1, N-V, H3 or N3 color center (cf. J. Phys., C: Solid State Phys., 17 (1984) 233–235. The conventional diamond hole-burning material has the below described drawbacks.

(1) At a temperature higher than 20 K., the holes disappear.

(2) The holes disappear within about 15 minutes even at a temperature of 20 K. or lower.

(3) At the temperature at which the holes can exist, the holes formed in a single spot cannot be erased without erasing the holes formed in other spots.

(4) The holes should be detected with microwave.

(5) A hole with a large depth cannot be formed.

(6) At a temperature higher than 77 K., plural holes cannot be burnt simultaneously.

SUMMARY OF THE INVENTION

One object of the present invention is to provide a hole-burning material which utilizes the color center of diamond and has the holes with long life even at a temperature higher than 20 K.

Another object of the present invention is to provide a hole-burning diamond material in which holes formed in a single spot can be erased without erasing holes formed in other spots.

A further object of the present invention is to provide a hole-burning diamond material having sufficiently deep holes.

A yet another object of the present invention is to provide a hole-burning diamond material in which plural holes can be formed at a temperature higher than 77 K.

These and other objects are achieved by a hole-burning material which comprises at least one hole which is formed on a zero-phonone line and semipermanently lasts without suffering from any change in the temperature range from 2 to 120 K. and which can be erased by irradiation of excited light having an energy larger than the zero-phonone line.

The hole-burning material of the present invention is preferably produced by irradiating a diamond having a nitrogen atom content of from $1 \times 10^{18}$ to $3 \times 10^{20}$ atoms/cm$^3$ selected from the group consisting of Ib type single crystal or polycrystal diamond synthesized in the diamond stable domain and Ib type single crystal or polycrystal diamond synthesized by a vapor deposition method with a neutron beam at a dose of $2 \times 10^6$ to $2 \times 10^9$ neutrons/cm$^2$ and annealing the irradiated diamond under a reduced pressure of not higher than 1 Torr at a temperature of 600 to 1,400° C. for at least one hour, or by irradiating said Ib type diamond with an electron beam having an energy of from 0.7 to 20 MeV at a dose of $1 \times 10^6$ to $2 \times 10^{19}$ electrons/cm$^2$ and annealing the irradiated diamond under a reduced pressure of not higher than 1 Torr at a temperature of 600 to 1,400° C. for at least one hour.

DETAILED DESCRIPTION OF THE DRAWINGS

Figure 1:
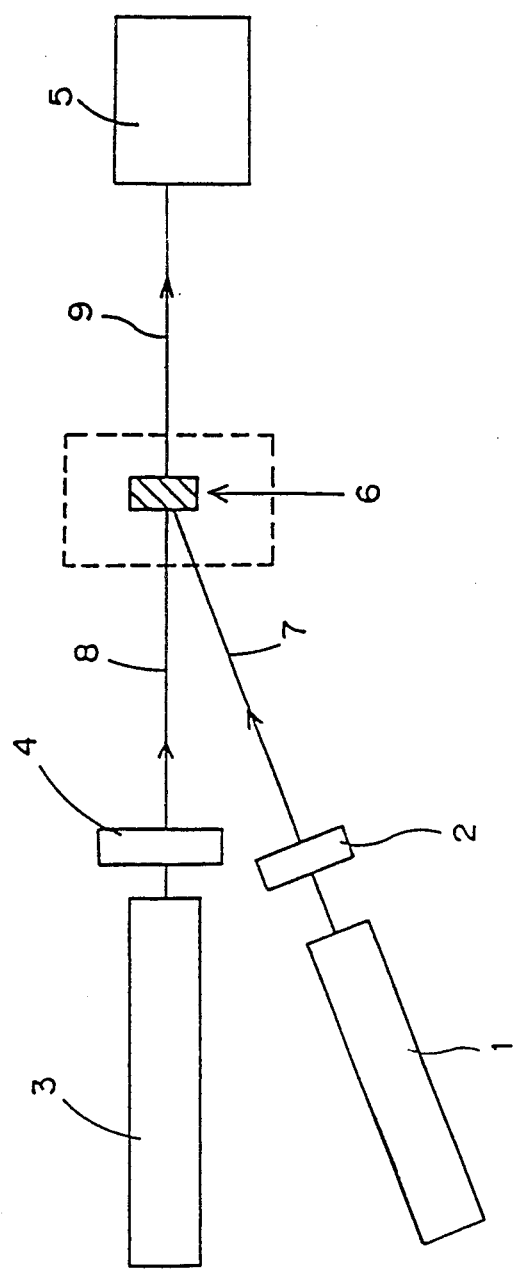
FIG. 1 schematically shows the apparatus for burning the holes in the hole-burning material.

In the present invention, among the color centers of the diamond, the zero-phonone line of the N-V center is utilized for burning the hole, since the zero-phonone line is suitable for hole-burning. This technique is suggested in J. Phys., C: Solid State Phys., loc. cit.

First, the characteristics of the method for producing the hole-burning material according to the present invention will be explained and then, the characteristics of the hole-burning material of the present invention will be explained.

Characteristics of the Production Method

The characteristics of the method for producing the hole-burning material are as follows:

(a) As a matrix in which the N-V color centers are formed, the synthetic Ib type diamond having the nitrogen atom content of $1 \times 10^{18}$ to $3 \times 10^{20}$ atoms/cm$^3$ is used. The N-V color center is formed from the combination of one nitrogen atom and a vacancy. Then, the diamone single dispersion type nitrogens is preferred.

The synthetic Ib diamond includes polycrystal diamond produced by the extra-high pressure method, single crystal diamond produced by the temperature gradient method, and single crystal or polycrystal diamond produced by the vapor deposition method.

The synthetic Ib type diamond includes diamonds produced by the following methods:

(i) Single crystal diamond produced by the temperature gradient method in the domain in which diamond is stable.

(ii) Polycrystal diamond produced by the sintering method in the domain in which diamond is stable.

(iii) Single crystal diamond produced by the film growing method in the domain in which the diamond is stable.

(iv) Single crystal or polycrystal diamond produced by the vapor deposition method.

The vapor deposition method includes the microwave CVD method, the DC plasma method, the laser PVD method, the hot filament method, the ion beam deposition method and the like. The Ib type diamond produced by any of these methods provides the same results.

Among the above diamonds, the Ib type diamonds produced by the methods (i), (ii) and (iv) are preferred, because of their good size and qualities.

When the nitrogen atom content is less than $1 \times 10^{18}$ atoms/cm$^3$, the formed hole cannot be erased at a temperature lower than 120 K. When the nitrogen atom content is larger than $3 \times 10^{20}$ atoms/cm$^3$, writing and erasing are difficult because of the too high concentration of the N-V centers.

(b) To generate the N-V color centers in the diamond, the vacancies should be generated in the diamond. Then, the diamond is irradiated with the neutron beam at a dose of $2 \times 10^{16}$ to $2 \times 10^{19}$ neutrons/cm$^2$ or the electron beam at a dose of $1 \times 10^{16}$ to $2 \times 10^{19}$ electrons/cm$^2$. The electron beam has the energy of 0.7 to 20 MeV, preferably at least 6 MeV. With the electron beam of 6 MeV or higher, the deep hole can be burnt. The deep holes can be easily detected so that informations written in the produced memory material can be read with very small error.

When the zero-phonone lines of the N-V centers are burnt with the neutron beam or the electron beam at a dose smaller than the above lower limit, the generated holes varies at a temperature higher than 20 K., and the life of the holes is not stable semipermanently. Even when the excitation light having the energy higher than the zero-phonone is irradiated, the generated holes cannot be erased at a temperature lower than 120 K.

When the irradiation dose is larger than the above upper limit, the diamond lattices are heavily damaged with the applied energy so that the irradiated diamond material absorbs the light in a wide wavelength range. Therefore, the zero-phonone lines of the N-V centers cannot be clearly detected.

When the electron beam energy is less than 0.7 MeV, plural holes cannot be burnt. From 10 MeV, the diamond is activated, and at a level higher than 20 MeV, the irradiated diamond should be kept standing for a long time to deactivate it.

(c) The irradiated diamond is annealed under a reduced pressure not higher than 1 Torr. at a temperature of from 600 to 1,400° C., preferably from 650 to 1,200° C. for at least one hour.

Through annealing, the nitrogen atom in the matrix and the vacancy generated by irradiation are combined to form the N-V center.

At the annealing temperature lower than 600° C., the absorption due to radiation damage (GRI centers) are not removed or no N-V center is formed. Also, at the annealing time shorter than one hour, the absorption due to the radiation damage is not removed. Under the pressure higher than 1 Torr., the surface of the diamond is graphited. When the radiation dose is large, the GRI centers may not be completely removed, but at a temperature higher than 650° C., the GRI centers can be completely removed. The number of the N-V centers gradually decreases from 1,200° C. Then, the preferred annealing temperature is from 650 to 1,200° C.

The Ib type diamond as such is known. However, it is not known that the Ib type diamond having the nitrogen atom content in the above range achieves good effects when used in the production of the hole-burning material.

Among the above characteristics, the irradiation conditions in (b) is the most important. By using such high energy radiation, the number of lattice defects in the diamond is increased.

The zero-phonone line of the N-V centers generated by the above method has a broad wavelength range and has following properties. Then, the diamond having such N-V centers functions as the good hole-burning material having the following characteristics.

(A) The burnt hole does not disappear in the temperature range of 2 to 120 K.

Figure 3:
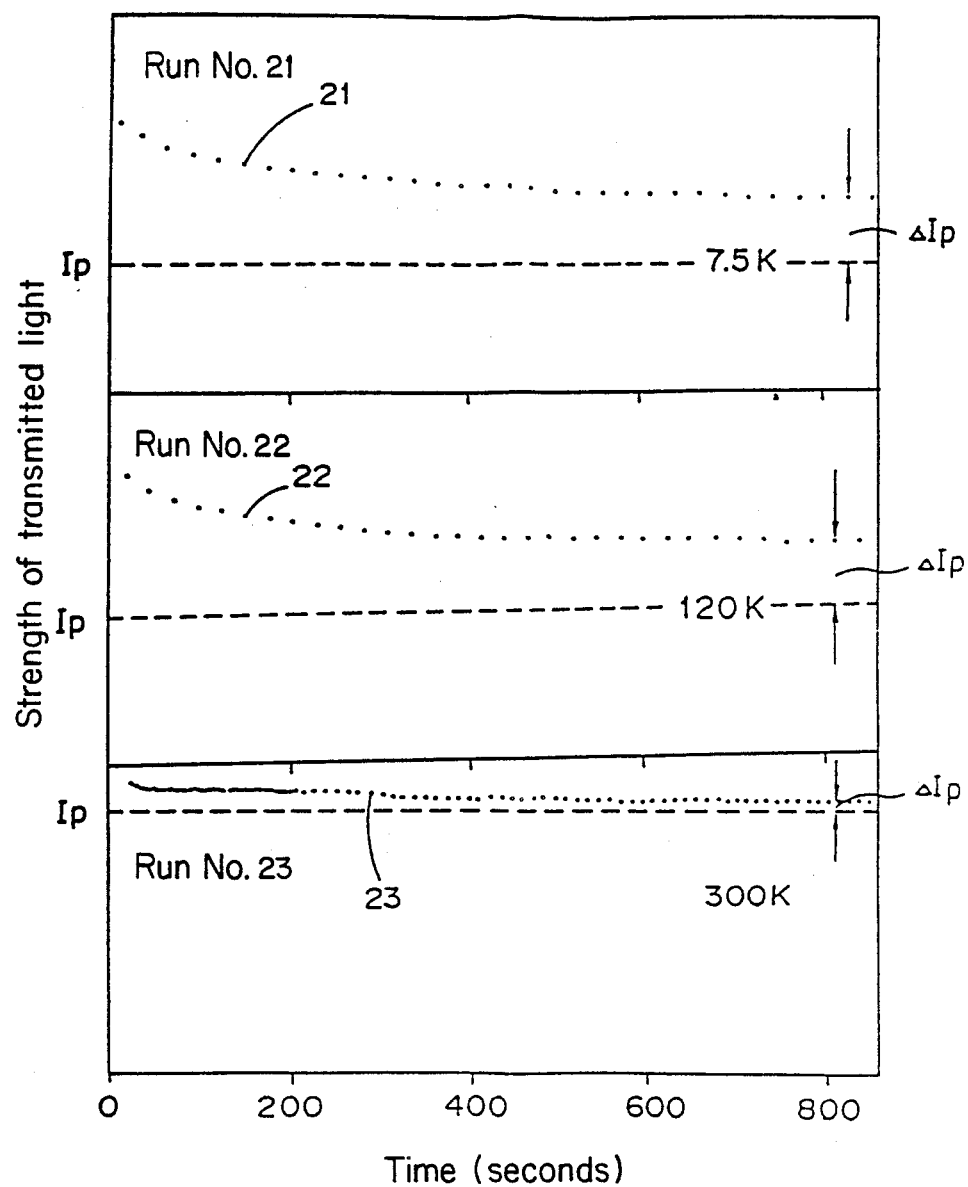
FIG. 3 shows the change of the strength of transmitted light through the hole-burning materials prepared in Example 3.

As shown in FIG. 3 in Example 3, in the temperature range from the liquid nitrogen to 120 K., the once burnt holes do not disappear. At a temperature higher than 120 K., the holes begin to disappear and at a temperature higher than 300 K., a considerable number of the holes disappear.

From the above results, it is seen that the hole burning effect can be achieved even at the liquid nitrogen temperature or higher according to the present invention, while in the prior art, the hole burning effect is achieved at the liquid helium temperature.

(B) The formed holes contain components having a time constant of about 20 seconds, components having a time constant of about 500 seconds and semipermanent components.

Since the burnt holes do not disappear semipermanently, the hole-burning material of the present invention can be practically used.

(C) The formed hole can be erased by irradiation of excited light having an energy larger than the zero-phonone line, preferably an energy not smaller than one phonone in a short time, for example, in a period of 300 seconds or less.

This feature is the most important in the present invention.

In the prior arts, the once burnt holes cannot be erased unless the hole-burning material is heated around room temperature or higher. However, when the hole-burning material is heated to room temperature, all the holes are erased. Thus, in the prior arts, it is impossible to erase any single hole at a desired position.

(D) It is possible to form plural identifiable holes in the temperature range of 77 to 120 K.

The number of the holes burnt on one zero-phonone line is one of the important factor. As the number of the holes increases, the write density increases. In one of the preferred embodiments of the present invention, at least three identifiable holes can be burnt.

The number of the burnt holes considerably depends on the temperature. At 120 K., the hole number is about 3, at 80 K., it is ten to twenty and at 20 K., it is 100 or larger. Around the liquid nitrogen temperature, the hole number is ten to twenty.

(E) In the hole-burning material, the hole can be formed with a laser having an energy density of at least $5 \times 10^{-5}$ W/cm$^2$.

In addition, it is possible to burn the hole in a depth of at least 40%.

PREFERRED EMBODIEMNTS OF THE INVENTION

The present invention will be illustrated by following Examples.

Example 1

By the temperature gradient method, under pressure of 5.4 GPa and at 1,400° C., the Ib type diamond of 2 carats containing 90 ppm of nitrogen atoms was synthesized and cut to a piece of $6 \times 6 \times 1$ mm.

After irradiating the diamond piece with the neutron beam at a dose of $5 \times 10^{15}$ to $5 \times 10^{19}$ neutrons/cm$^2$, the diamond piece was annealed at 900° C. under pressure of $10^{-3}$ Torr. for 20 hours.

The presence of the N-V centers was confirmed by visible light spectral analysis. The content of the nitrogen atoms in the Ib type diamond was calculated from the absorption coefficient at 1,130 cm$^{-1}$ in IR spectroscopic analysis.

By using the apparatus shown in FIG. 1, the holes were burnt on the zero-phonone lines of the N-V centers. The laser beam 7 was generated by the laser 1 and irradiated on the diamond piece 6 to burn holes. The irradiation of the laser beam 7 was on and off with the shutter 2.

Figure 2:
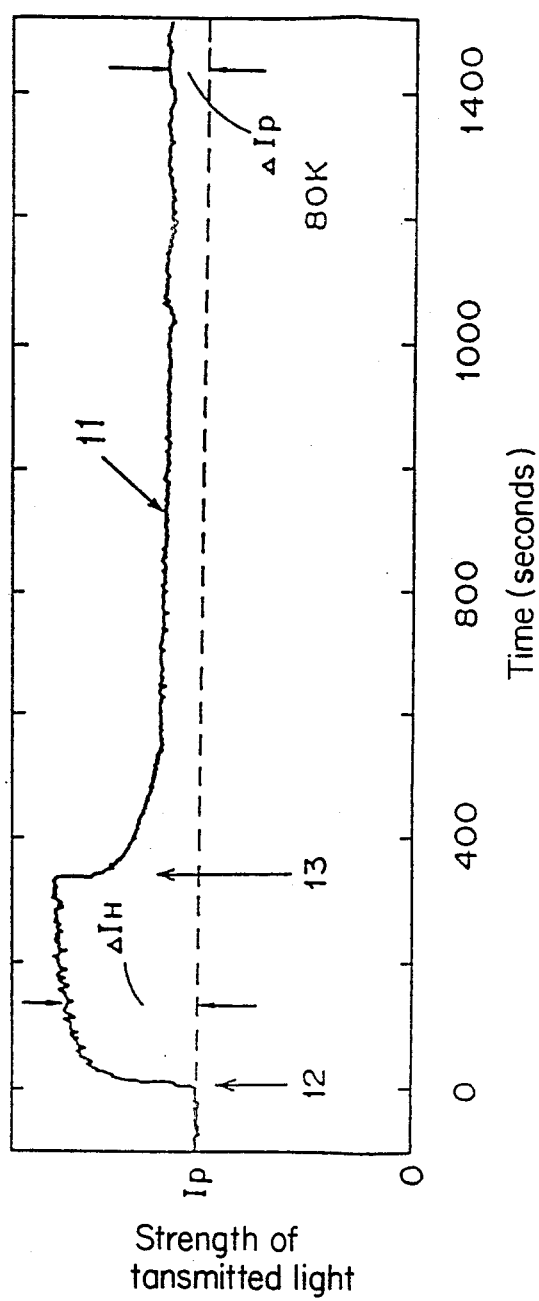
FIG. 2 is a typical spectrum of the strength of transmitted light through the hole-burning material of the present invention.

The holes were observed by illuminating the diamond piece 6 with the laser beam 8 generated by the laser 3 through the damping filter 4 and measuring the strength of the transmitted light 9 with the detector 5. The strength of the transmitted light 9 is shown by the spectrum curve 11 in FIG. 2. The strength of the transmitted light through the diamond before hole-burning is indicated by "$I_p$" in FIG. 2.

As the laser 1 or 3, the He-Ne laser with 0.5 mW was used. As the damping filter 4, one having the damping factor of 1/100 was used. The sample was cooled with cryostat.

When the laser beam 7 was irradiated on the diamond piece 6, at the time 12, the hole-burning started and then the strength of the transmitted light increased. When the irradiation was cut with the shutter 2 at the time 13, a part of the holes disappeared, but the residual strength $\Delta I_p$ which did not disappear remained. Such residual strength is used for memory.

With varying the irradiation dose of neutron beam, five pieces of the Ib type diamond were burnt to generate holes by the above procedures. The results are shown in Table 1.

TABLE 1

| Run No. | 1 | 2 | 3 | 4 | 5 |
|---|---|---|---|---|---|
| Dose of neutron beam (neutrons/cm$^2$) | $5 \times 10^{15}$ | $1 \times 10^{16}$ | $9 \times 10^{16}$ | $2 \times 10^{19}$ | $5 \times 10^{19}$ |
| Increase ratio of transmitted light ($\Delta I_p/I_p$) | ca. 0.05 | 0.20 | 0.30 | 0.30 | N.M.*[1] |

Note: *[1]Not measured due to other strong absorption.

Example 2

The diamond was synthesized by the plasma CVD method as follows:

Plasma was generated with the radiofrequency of 2.5 GHz under pressure of 30 Torr. and the diamond was deposited on a silicon substrate with doping nitrogen atoms at a deposition rate of 5 μm/hr. to a thickness of 100 μm. Then the diamond film was recovered by dissolving the silicon substrate with an acid. The produced diamond film was polycrystal.

The diamond film was irradiated with the electron beam of 5 MeV at a dose indicated in Table 2, and then annealed under pressure of 1 Torr. at 600° C. for 5 hours.

The annealed diamond film was subjected to hole-burning according to the procedures of Example 1.

In this Example, as the laser 1 or 3, the variable laser system comprising the Ar+ laser and the dye laser, which laser system had output of 5 mW. As the filter 4, one having the damping ratio of 1/1000 was used.

The results are shown in Table 2.

TABLE 2

| Run No. | 11 | 12 | 13 | 14 | 15 |
|---|---|---|---|---|---|
| Dose of electron beam (electrons/cm$^2$) | $5 \times 10^{15}$ | $1 \times 10^{17}$ | $1 \times 10^{19}$ | $1 \times 10^{20}$ | $1 \times 10^{21}$ |
| Increase ratio of transmitted light ($\Delta I_p/I_p$) | about 0 | 0.20 | 0.35 | 0.30 | N.M.*[1] |

Note: *[1]Not measured due to other strong absorption.

When the diamond film is synthesized by the DC plasma method, the hot filament method, the hot filament CVD method, the ion beam deposition method, the microwave plasma method or the laser PVD method, the same results as in this Example can be achieved. When the diamond film is formed on a substrate made of Mo, W, Ti, Zr, Hf or alloys thereof, carbides (e.g. WC, SiC, MoC, TiC, ZrC, HfC, etc.) SiO$_2$, Al$_2$O$_3$, SiC or single crystal diamond, the same results as above are achieved. When the single crystal diamond is used as the substrate, the deposited diamond is also single crystal.

Example 3

Three pieces of the Ib type diamond were prepared by the same procedures as in Run No. 3 of Example 1. Then, the strength of the transmitted light and its temperature dependency were examined. To evaluated the temperature dependency, the strength of the transmitted light was measured at 7.5 K. (Run No. 21), 120 K. (Run No. 22) or 300 K. (Run No. 23).

The results are shown in FIG. 3. The dotted lines 21, 22, and 23 in FIG. 3 represent change of strength of transmitted light after closing the shutter 2 for runs 21, 22 and 23, respectively. $I_p$ and $\Delta I_p$ have the same meaning as in FIG. 2.

As understood from the results of FIG. 3, the changes of the transmitted light in the temperature range of 7.5 to 120 K. are substantially the same. However, at 300 K., the ratio of $\Delta I_p/I_p$ was about 0.05, which means that the considerable amount of the holes disappeared.

Example 4

One piece of the diamond produced in the same manner as in Run No. 3 of Example 1 was subjected to the same treatment as in Example 1. Then, the strength of transmitted light and its change with time were examined at 80 K. The results are shown in Table 3, in which "time" was measured from the shutter closing time (termination of hole burning). The results indicate that the holes were reserved even after 10 hours.

TABLE 3

| Time (sec.) | 600 | 1200 | 2400 | 4800 | 9600 | 19200 | 36000 |
|---|---|---|---|---|---|---|---|
| Increase ratio of transmitted light ($\Delta I_p/I_p$) | 0.04 | 0.35 | 0.30 | 0.29 | 0.29 | 0.28 | 0.29 |

Example 5

Four pieces of diamond were produced in the same manner as in Run No. 4 of Example 1. The same experiments were carried out with these sample pieces in the same manner as in Example 1, except that, in this Example, at the time 12 in FIG. 2, the shutter was opened so as to monitor the change of strength of transmitted light depending on the strength of the hole-burning laser beam 7 of FIG. 1. The results are shown in Table 4, in which "hole-forming time" is a time required for 10% increase of the strength of transmitted light due to hole-burning, namely a time at which the ratio $\Delta I_p/I_p$ is 0.10.

TABLE 4

| Run No. | 31 | 32 | 33 | 34 |
|---|---|---|---|---|
| Strength of laser beam (W/cm$^2$) | $1 \times 10^{-5}$ | $5 \times 10^{-5}$ | $1 \times 10^{-2}$ | 1 |
| Hole-forming time (sec.) | Not formed | 180 | 1 | $8 \times 10^{-3}$ |

These results indicate that the energy of laser beam of at least $5 \times 10^{-5}$ W/cm$^2$ is sufficient.

Example 6

By the temperature gradient method, under pressure of 5.5 GPa and at a temperature of 1,350 to 1,420° C., five pieces of the Ib type diamond of 3 to 3.2 carats having the nitrogen content of $5 \times 10^{17}$ to $5 \times 10^{20}$ atoms/cm$^3$ were synthesized and cut to $7 \times 7 \times 0.2$-3 (thickness) mm.

After irradiating the diamond pieces with the neutron beam at a dose of $1.2 \times 10^{17}$ neutrons/cm$^2$, the diamond pieces were annealed at 800° C. under pressure of $10^{-2}$ Torr. for 10 hours.

The content of the nitrogen atoms in the Ib type diamond was calculated from the absorption coefficient at 1,130 cm$^{-1}$ in IR spectroscopic analysis. The presence of the N-V color centers was confirmed by UV-visible light spectral analysis.

The hole-burning was carried out in the same manner as in Example 1.

In this Example, as the laser 1 or 3, the variable laser system comprising the Ar$^+$ laser and the dye laser as in Example 2. The wavelength was 638 nm.

The results are shown in Table 5.

TABLE 5

| Run No. | 41 | 42 | 43 | 44 | 45 |
|---|---|---|---|---|---|
| Synthesis Temp. (° C.) | 1400 | 1370 | 1350 | 1420 | 1400 |
| Synthesis solvent | Fe—15 Ni | Fe—20 Ni | Fe—50 Ni | Ni | Ni |
| Nitrogen content (atoms/cm$^2$) | $5 \times 10^{17}$ | $1 \times 10^{18}$ | $1.7 \times 10^{19}$ | $3 \times 10^{20}$ | $5 \times 10^{20}$ |
| Thickness (mm) | 3.0 | 2.0 | 1.0 | 0.2 | 0.2 |
| Increase ratio of transmitted light ($\Delta I_p/I_p$) | 0.07 | 0.25 | 0.30 | 0.30 | N.M.*[1] |
| Hole erasability at 80K | No | Yes | Yes | Yes | — |

Note:
*[1] Not measured due to other strong absorption.

The hole erasability was determined by adjusting the output wavelength of the laser 1 in FIG. 1, opening the shutter 2 and then measuring the strength of the transmitted light 9.

Example 7

The diamond was synthesized by the plasma CVD method as follows:

Plasma was generated with the radiofrequency of 2.4 GHz under pressure of 25 Torr. and the diamond was deposited on a silicon substrate with doping nitrogen atoms at a deposition rate of 7 μm/hr. to a thickness of 200 μm. Then the diamond film was recovered by dissolving the silicon substrate with an acid. The produced diamond film was polycrystal.

The diamond film was cut to five pieces. Among them, four pieces of the diamond film were irradiated with the neutron beam at a dose of $8 \times 10^{15}$ to $3 \times 10^{19}$ neutrons/cm$^2$, and one of them was chemically analyzed on the nitrogen content to find that the nitrogen content was $4 \times 10^{19}$ atoms/cm$^3$. Then, the irradiated pieces were annealed under pressure of 0.1 Torr. at 650° C. for one hour.

The annealed diamond film was subjected to hole-burning and hole erasing according to the procedures of Example 6.

The results are shown in Table 6.

TABLE 6

| Run No. | 51 | 52 | 53 | 54 | 55 |
|---|---|---|---|---|---|
| Dose of neutron beam (neutrons/cm$^2$) | $8 \times 10^{15}$ | $1.5 \times 10^{16}$ | $3.5 \times 10^{17}$ | $1.5 \times 10^{19}$ | $3 \times 10^{19}$ |
| Increase ratio of transmitted light ($\Delta I_p/I_p$) | ca. 0.05 | 0.20 | 0.25 | 0.30 | N.M.*[1] |
| Hole erasability at 120K | No | Yes | Yes | Yes | — |

Note:
*[1] Not measured due to other strong absorption.

When the diamond film is synthesized by the DC plasma method, the hot filament method, the hot filament CVD method, the ion beam deposition method, the microwave plasma method or the laser PVD method, the same results as in this Example can be achieved. When the diamond film is formed on a substrate made of Mo, W, Ti, Zr, Hf, alloys or carbides thereof, SiO$_2$, Al$_2$O$_3$, SiC or single crystal diamond, the same results as above are achieved. When the single crystal diamond is used as the substrate, the deposited diamond is also single crystal.

Example 8

By the temperature gradient method, under pressure of 5.2 GPa and at 1,350° C., in the solvent of Fe-40Ni, five pieces of Ib type diamond of 2.8 to 3.2 carats having the nitrogen content of $1.2 \times 10^{19}$ atoms/cm³ ppm were synthesized and cut to $6 \times 6 \times 1$ mm.

After irradiating the diamond pieces with the electron beam at a dose of $5 \times 10^{16}$ to $5 \times 10^{20}$ electrons/cm², the diamond pieces were annealed at 1,200° C. under pressure of $10^{-3}$ Torr. for 5 hours.

The nitrogen content and the presence of the N-V centers were measured by the same methods as in Example 1, and the hole-burning and hole-erasing were carried out in the same manner as in Example 6.

The results are shown in Table 7.

TABLE 7

| Run No. | 61 | 62 | 63 | 64 | 65 |
|---|---|---|---|---|---|
| Dose of electron beam (neutrons/cm²) | $5 \times 10^{16}$ | $2 \times 10^{17}$ | $1 \times 10^{18}$ | $1.5 \times 10^{20}$ | $5 \times 10^{20}$ |
| Increase ratio of transmitted light ($\Delta I_p/I_p$) | ca. 0.03 | 0.25 | 0.35 | 0.30 | N.M.*[1] |
| Hole erasability at 120K | No | Yes | Yes | Yes | — |

Note:
*[1]Not measured due to other strong absorption.

Example 9

By changing the temperature as in Table 8, the hole formation was checked on the diamond piece used in Run No. 64 of Example 8. The results are shown in Table 8 and also in FIG. 4.

TABLE 8

| Run No. | 71 | 72 | 73 |
|---|---|---|---|
| Temp. (K) | 5 | 120 | 300 |
| Increase ratio of transmitted light ($\Delta I_p/I_p$) | 0.30 | 0.30 | 0.05 |

Figure 4:
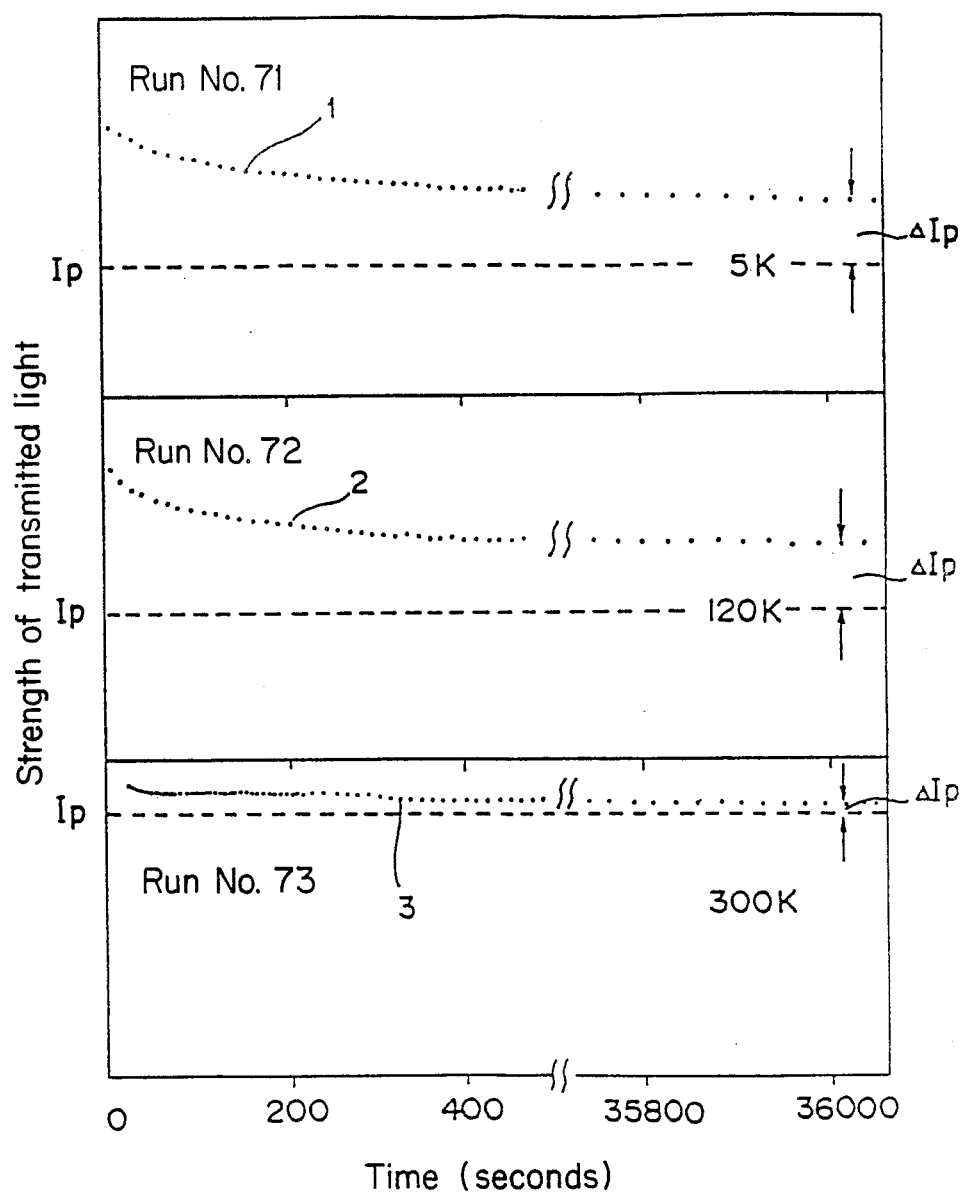
FIG. 4 shows the change of the strength of transmitted light through the hole-burning materials prepared in Example 9.

As understood from FIG. 4, even after 10 hours, $\Delta I_p$ did not change at 120 K. This is shown by the dotted lines 1, 2 and 3 which represent the change of strength of transmitted light for runs 71, 72 and 73, respectively. This means that the holes were present semipermanently.

Example 10

By using the diamond used in Run No. 43 of Example 6, possibility of the hole-burning and hole erasing was examined at 120 K. To this end, the following experiments were carried out.

(1) Whether or not the hole is burnt, when the wavelength is changed.

(2) Whether or not the burnt holes can be erased with the excited light having the wavelength of 630 nm, namely the light having the energy of larger than zero-phonone.

(3) Whether or not the burnt hole can be erased with the excited light having the wavelength of 580 nm or 550 nm, namely the light having the energy of larger than one phonone.

(4) Whether writing and erasing are possible after repeating the experiments (1) and (3).

In the above experiment (1), etalons were installed in the dye lasers 1 and 3 of the apparatus of FIG. 1 to achieve the minute change of the wavelength. With varying the wavelength of the excited light 7 for hole burning (writing) and opening the shutter 2, the light was irradiated on the sample 6. The wavelength of the transmission light 8 was also varied with the etalon near the wavelength of the light 7. The presence of the holes was checked by measuring the hole profile.

In the experiments (2) and (3), the hole erasability was judged by burning the holes in the sample 6 with opening the shutter 2 while adjusting the wavelengths of the lasers 7 and 8 at the same value, closing the shutter, irradiating the sample while varying only the wavelength of the light 7 at 635 nm, 585 nm or 550 nm, and detecting the change of strength of transmitted light 9.

The results are shown in Table 9.

TABLE 9

| Run No. | 81 | 82 | 83 | 84 | 85 |
|---|---|---|---|---|---|
| Wavelength for hole writing (nm) | 637.0 | 637.5 | 638.0 | 638.5 | 639.0 |
| Increase ratio of transmitted light ($\Delta I_p/I_p$) in experiment 1 | 0.35 | 0.30 | 0.30 | 0.30 | 0.35 |
| Erase of holes in experiment 2 | Erased gradually | | | | |
| Erase of holes in experiment 3 | Erased in short time | | | | |
| Repeated writing and erasing | Yes | Yes | Yes | Yes | Yes |

As understood from the results of Table 9, in the domain of the zero phonone line, the holes can be burnt at any wavelength and erased in a short time with the excited light having the energy of larger than one phonone, and such burning (writing) and erasing can be repeated.

Example 11

By the temperature gradient method, under pressure of 5.5 GPa and at 1,420° C. in the solvent of Fe-50Ni, four pieces of the Ib type diamond of 3 to 3.2 carats containing 80 to 85 ppm of nitrogen atoms were synthesized in 100 hours and cut to a piece of $7 \times 7 \times 1$ mm.

After irradiating the diamond piece with the electron beam at an acceleration voltage of 1.5 to 190 MeV and a dose of $5 \times 10^{17}$ electrons/cm², the irradiated diamond pieces were annealed at 850° C. under pressure of $1 \times 10^{-3}$ Torr. for 5 hours to create the N-V centers.

Then, the holes were burnt in the same manner as in Example 1 at 120 K. The results are shown in Table 10, in which the hole depth was calculated according to the following equation:

$$\text{Hole depth } (\%) = \frac{(I_p - I_H)}{(I_O - I_p)} \times 100$$

wherein $I_O$ is the strength of the transmitted light before the formation of the N-V centers, $I_p$ is the strength of the transmitted light before the hole burning, and $I_H$ is the strength of the transmitted light after the hole burning.

TABLE 10

| Run No. | 91 | 92 | 93 | 94 |
|---|---|---|---|---|
| Acceleration voltage (MeV) | 1.5 | 6 | 20 | 190 |
| Hole depth (%) | 20 | 40 | 80 | 80 |

Figure 5:
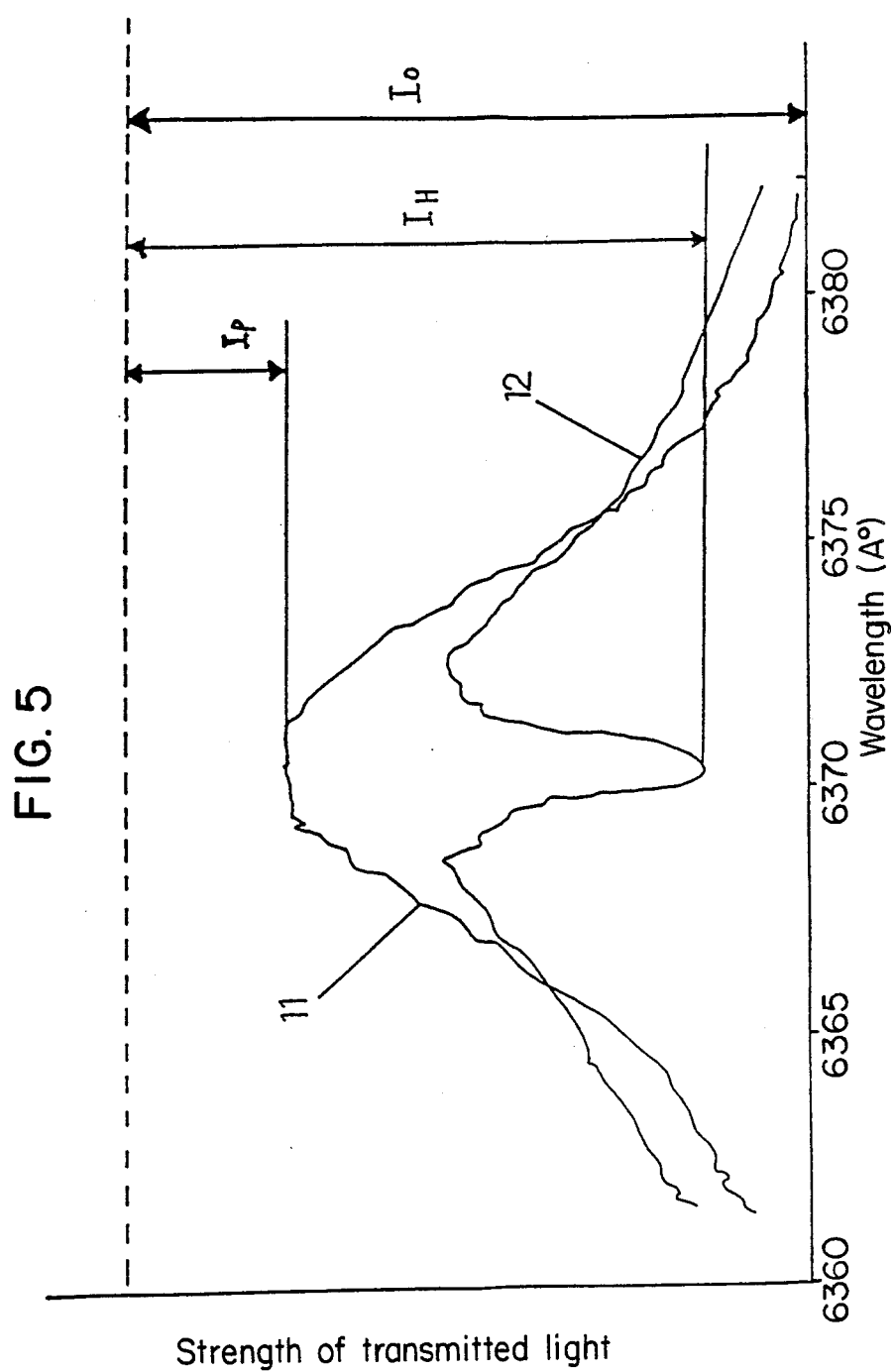
FIG. 5 shows the spectra of the strength of transmitted light through the hole-burning material prepared in Example 11.

FIG. 5 shows the hole spectra of Run No. 93. The curves 11 and 12 represent the spectrum before hole burning and that after hole burning, respectively.

Example 12

The diamond was synthesized by the plasma CVD method as follows:

Plasma was generated with the radiofrequency of 2.5 GHz under pressure of 25 Torr. and the diamond was deposited on a silicon substrate with doping nitrogen atoms at a deposition rate of 5 μm/hr. to the thickness of 100 μm. Then the diamond film was recovered by dissolving the silicon substrate with an acid. The produced diamond film was polycrystal.

The diamond film was cut to five pieces and irradiated with the electron beam of at a dose of $5 \times 10^{15}$ to $1.5 \times 10^{20}$ electrons/cm². Then, the irradiated pieces were annealed under pressure of 1 Torr. at 800° C. for one hour.

The annealed diamond film was subjected to hole-burning and hole erasing according to the procedures of Example 11.

The results are shown in Table 11.

TABLE 11

| Run No. | 101 | 102 | 103 | 104 | 105 |
|---|---|---|---|---|---|
| Dose of electron beam (electrons/cm²) | $5 \times 10^{15}$ | $1.5 \times 10^{16}$ | $5 \times 10^{17}$ | $5 \times 10^{19}$ | $1.5 \times 10^{20}$ |
| Hole depth (%) | 5 | 50 | 80 | 80 | N.M.*[1] |

Note:
*[1] Not measured due to other strong absorption.

Example 13

Under pressure of 7.0 GPa, at 1,700° C., the polycrystal diamond was synthesized in the Ni solvent. The synthesized diamond piece was cut to four pieces and treated with an acid. Then, the diamond pieces were irradiated with the electron beam at an acceleration voltage of 20 MeV and at a dose of $5 \times 10^{17}$ electrons/cm². The irradiated diamond pieces were annealed under 1 Torr. at a temperature of 500 to 1,600° C. for 3 hours. The holes were burnt and their depth was measured in the same manners as in Example 11. The results are shown in Table 12.

TABLE 12

| Run No. | 111 | 112 | 113 | 114 |
|---|---|---|---|---|
| Annealing temp. (°C.) | 500 | 600 | 1400 | 1600 |
| Hole depth (%) | No N-V center formed | 60 | 50 | N-V center disappeared |

Example 14

The diamond piece used in Run No. 103 of Example 11 was set in the apparatus of FIG. 1. Then, the holes were burnt while varying the temperature. The results are shown in Table 13.

TABLE 13

| Run No. | 121 | 122 | 123 | 124 |
|---|---|---|---|---|
| Sample temp (°C.) | 2 | 120 | 180 | 300 |
| Hole depth (%) | 80 | 80 | 30 | 3 |

Example 15

By the temperature gradient method, under pressure of 5.5 GPa and at a temperature of 1,350° to 1,400° C., five pieces of the Ib type diamond of 5 to 5.5 carats having the nitrogen content of $5 \times 10^{17}$ to $3 \times 10^{20}$ atoms/cm³ were synthesized and cut to $9 \times 9 \times 1$ mm.

After irradiating the diamond pieces with the neutron beam at a dose of $2 \times 10^{17}$ neutrons/cm², the diamond pieces were annealed at 900° K. under pressure of $10^{-2}$ Torr. for 10 hours.

The presence of the N-V color centers was confirmed by visible light spectral analysis. The content of the nitrogen atoms in the Ib type diamond was calculated from the absorption coefficient at 1,130 cm⁻¹ in IR spectroscopic analysis.

The holes were burnt by the apparatus of FIG. 1 at 120 K. The presence of the holes was determined from the hole strength ratio of the equation:

$$\text{Hole strength ratio (\%)} = \frac{I_H - I_p}{I_p} \times 100$$

wherein $I_p$ and $I_H$ are the same as defined above.

The results are shown in Table 14.

TABLE 14

| Run No. | 131 | 132 | 133 | 134 | 135 |
|---|---|---|---|---|---|
| Synthesis Temp. (°C.) | 1400 | 1370 | 1350 | 1420 | 1410 |
| Synthesis solvent | Fe—20 Co | Fe—30 Co | Fe—60 Co | Co—20 Ni | Ni |
| Nitrogen (atoms/cm³) | $5 \times 10^{17}$ | $1 \times 10^{18}$ | $2 \times 10^{19}$ | $3 \times 10^{20}$ | $4.5 \times 10^{1020}$ |
| Number*[1] of burnt holes | 0 | 3 | 5 | 5 | N.M.*[2] |

Note
*[1] The holes having the hole strength ratio of 15% or larger were counted.
*[2] Not measured due to other strong absorption.

Figure 6:
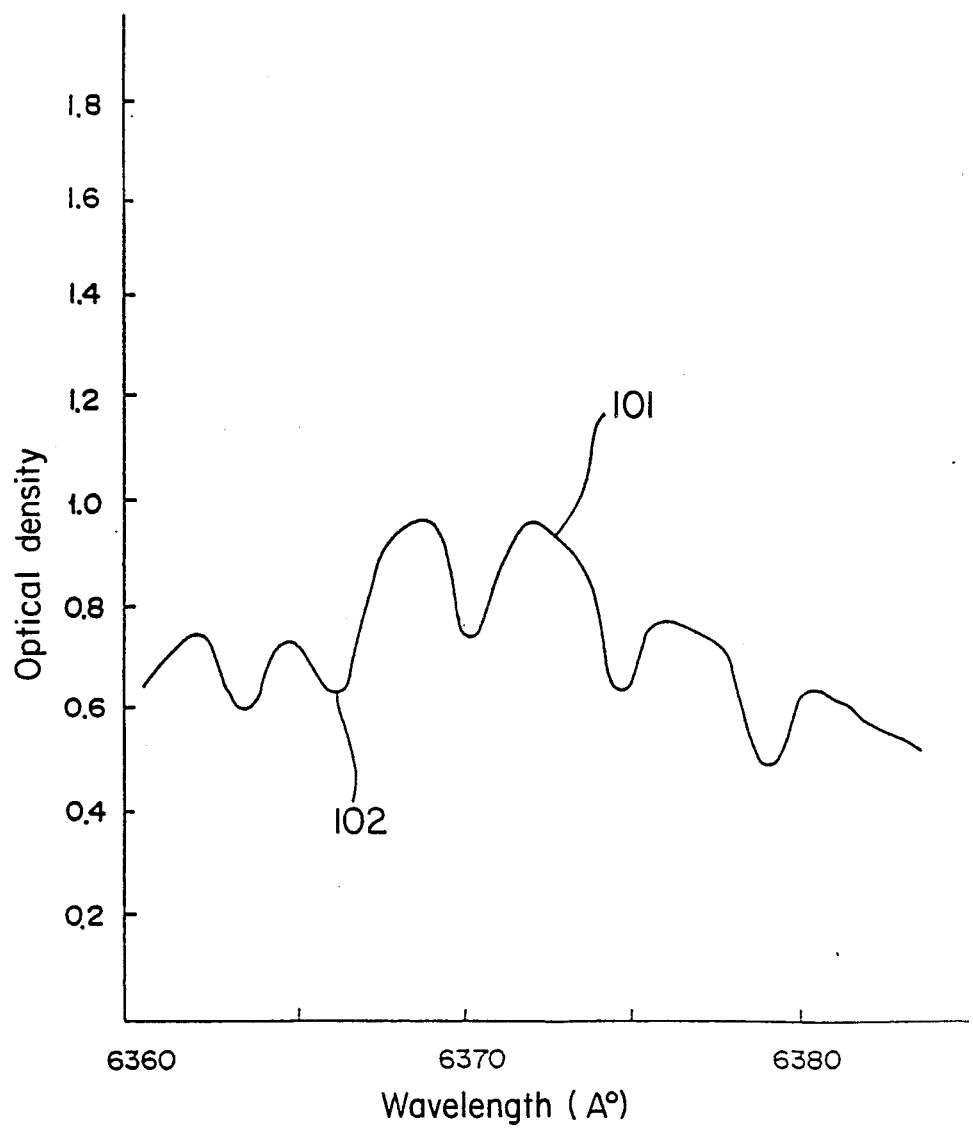
FIG. 6 shows the absorption spectrum (optical density) of the diamond sample in Run No. 133 of Example 14.

FIG. 6 shows the absorption spectrum on the zero-phonone line of Sample No. 133 observed by the same method as in Example 1. In FIG. 6, the curve 101 is the absorption spectrum on the zero-phonone line, and "102" represents the hole burnt. For the observation of the spectrum, a combination of a spectroscope and a photomultiplier was used as the detector 5.

Example 16

By the temperature gradient method, under pressure of 5.4 GPa and at 1,350° C. in the Fe-50Co solvent, five pieces of the Ib type diamond of 6 to 7 carats having the nitrogen content of $1 \times 10^{19}$ atoms/cm³ were synthesized and cut to $10 \times 10 \times 1$ mm.

After irradiating the diamond pieces with the electron beam at an acceleration voltage of 10 MeV and a dose of $1 \times 10^{17}$ to $3 \times 10^{20}$ electrons/cm², the diamond pieces were annealed at 600° C. under pressure of $10^{-1}$ Torr. for one hour.

The hole strength ratio was calculated by the same way as in Example 15, and the number of the holes with the hole strength ratio of larger than 15% was counted. This measurement was done at 80 K. The results are shown in Table 15.

TABLE 15

| Run No. | 141 | 142 | 143 | 144 | 145 |
|---|---|---|---|---|---|
| Dose of electron beam (atoms/cm$^3$) | $1 \times 10^{17}$ | $2 \times 10^{17}$ | $2 \times 10^{18}$ | $1.5 \times 10^{20}$ | $3 \times 10^{20}$ |
| Number*$^1$ of burnt holes | 0 | 7 | 18 | 18 | N.M.*$^2$ |

Note:
*$^1$The holes having the hole strength ratio of 15% or larger were counted.
*$^2$Not measured due to other strong absorption.

The same experiments were repeated with varying the acceleration voltage from 0.5 to 25 MeV. At the acceleration voltage of 0.7 or smaller, plural holes having the hole strength ratio of 15% or larger were not formed. At the acceleration voltage larger than 20 MeV, the diamond was strongly activated, so that it took long time to deactivate it.

Example 17

The diamond was synthesized by the plasma CVD method as follows:

Plasma was generated with the radiofrequency of 2.4 GHz under pressure of 30 Torr. and the diamond was deposited on a silicon substrate with doping nitrogen atoms at a deposition rate of 10 μm/hr. to the thickness of 150 μm. Then the diamond film was recovered by dissolving the silicon substrate with an acid. The produced diamond film was polycrystal.

The diamond film was cut to five pieces. Among them, four pieces of the diamond film were irradiated with the neutron beam of at a dose of $1 \times 10^{16}$ to $3 \times 10^{19}$ neutrons/cm$^2$, and one of them was chemically analyzed on the nitrogen content to find that the nitrogen content was $5 \times 10^{18}$ atoms/cm$^3$. Then, the irradiated pieces were annealed under pressure of $10^{-3}$ Torr. at 800° C. for 4 hours.

The annealed diamond film was subjected to hole-burning and measurement of the hole strength ratio. Then, the number of the holes having the hole strength of 15% or larger was counted. This measurement was done at 100 K.

The results are shown in Table 16.

TABLE 16

| Run No. | 151 | 152 | 153 | 154 |
|---|---|---|---|---|
| Dose of neutron beam (atoms/cm$^3$) | $1 \times 10^{16}$ | $2 \times 10^{16}$ | $2 \times 10^{19}$ | $3 \times 10^{19}$ |
| Number*$^1$ of burnt holes | 0 | 5 | 10 | N.M.*$^2$ |

Note:
*$^1$The holes having the hole strength ratio of 15% or larger were counted.
*$^2$Not measured due to other strong absorption.

What is claimed is:

1. A hole-burning diamond material which comprises at least one hole which is formed on a zero-phonon line and semi-permanently lasts without suffering from any change in the temperature range from 20 to 120 K. and which can be erased by irradiation of excited light having an energy larger than the zero-phonon line.

2. The hole-burning material according to claim 1, wherein the hole to be formed in said hole-burning material can be erased with excited light having an energy not smaller than one phonone.

3. The hole-burning material according to claim 1, wherein plural holes are burnt on the zero-phonone line.

4. The hole-burning material according to claim 1, wherein the hole is burnt with a laser having an energy density of at least $5 \times 10^{-5}$ W/cm$^2$.

5. The hole-burning material according to claim 1, wherein the hole burnt in said hole burning material has a time constant of about 20 seconds, a time constant of about 500 seconds and a semi-permanent time constant of at least 1 hour.

6. The hole-burning material according to claim 1, wherein the hole is burnt to a depth of at least 40%.

7. A method for producing a hole-burning material according to claim 1, which method comprises steps of:
irradiating a diamond having a nitrogen atom content of from $1 \times 10^{18}$ to $3 \times 10^{20}$ atoms/cm$^3$ selected from the group consisting of Ib type single crystal or polycrystal diamond synthesized in the diamond stable domain and Ib type single crystal or polycrystal diamond synthesized by a vapor deposition method with a neutron beam at a dose of $2 \times 10^6$ to $2 \times 10^9$ neutrons/cm$^2$ and
annealing the irradiated diamond under a reduced pressure of not higher than 1 Torr at a temperature of 600 to 1,400° C. for at least one hour.

8. A method for producing a hole-burning material according to claim 1, which method comprises steps of:
irradiating a diamond having a nitrogen atom content of from $1 \times 10^{18}$ to $3 \times 10^{20}$ atoms/cm$^3$ selected from the group consisting of Ib type single crystal or polycrystal diamond synthesized in the diamond stable domain and Ib type single crystal or polycrystal diamond synthesized by a vapor deposition method with an electron beam having an energy of from 0.7 to 20 MeV at a dose of $1 \times 10^6$ to $2 \times 10^{19}$ electrons/cm$^2$ and
annealing the irradiated diamond under a reduced pressure of not higher than 1 Torr at a temperature of 600 to 1,400° C. for at least one hour.

9. A hole-burning diamond material which comprises at least one hole which is formed on a zero phonon line and semi-permanently lasts without suffering from any change in the temperature range from 20 to 120 K. and which can be erased by irradiation of excited light having an energy larger than the zero phonon line; wherein said hole burning diamond material is a diamond which possesses a N-V color center.

* * * * *